(12) United States Patent
Yug

(10) Patent No.: US 12,069,935 B2
(45) Date of Patent: Aug. 20, 2024

(54) DISPLAY MODULE, DISPLAY APPARATUS INCLUDING THE SAME, AND METHOD OF MANUFACTURING THE DISPLAY APPARATUS

(71) Applicant: Samsung Display Co., Ltd., Yongin-si (KR)

(72) Inventor: Geunwoo Yug, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/230,518

(22) Filed: Aug. 4, 2023

(65) Prior Publication Data
US 2023/0380210 A1 Nov. 23, 2023

Related U.S. Application Data

(62) Division of application No. 16/843,890, filed on Apr. 9, 2020, now Pat. No. 11,812,628.

(30) Foreign Application Priority Data

May 17, 2019 (KR) .......... 10-2019-0057676

(51) Int. Cl.
*H10K 71/00* (2023.01)
*H10K 50/842* (2023.01)
*H10K 71/20* (2023.01)

(52) U.S. Cl.
CPC ......... *H10K 71/00* (2023.02); *H10K 50/8426* (2023.02); *H10K 71/231* (2023.02)

(58) Field of Classification Search
CPC .. H10K 50/8426; H10K 71/00; H10K 71/231; H10K 71/80; H10K 71/851
See application file for complete search history.

(56) References Cited

U.S. PATENT DOCUMENTS

| | | | |
|---|---|---|---|
| 9,827,753 | B2 | 11/2017 | Son et al. |
| 10,355,241 | B2 | 7/2019 | Ahn et al. |
| 10,686,161 | B2 | 6/2020 | Kang et al. |
| 10,732,445 | B2 | 8/2020 | Shin et al. |
| 10,838,113 | B2 | 11/2020 | Kwon et al. |
| 2017/0324060 | A1 | 11/2017 | Kim et al. |
| 2018/0102480 | A1 | 4/2018 | Yug |
| 2018/0159087 | A1* | 6/2018 | Yug ........................ H10K 77/10 |
| 2019/0157582 | A1 | 5/2019 | Yug |

FOREIGN PATENT DOCUMENTS

| KR | 101743884 B1 | 6/2017 |
|---|---|---|
| KR | 1020170106562 A | 9/2017 |
| KR | 1020170140491 A | 12/2017 |
| KR | 1020180070784 A | 6/2018 |
| KR | 101922922 B1 | 11/2018 |
| KR | 1020180125094 A | 11/2018 |
| KR | 1020190014273 A | 2/2019 |
| KR | 1020190038725 A | 4/2019 |
| KR | 1020200121948 A | 10/2020 |

* cited by examiner

*Primary Examiner* — Michael Jung
(74) *Attorney, Agent, or Firm* — CANTOR COLBURN LLP

(57) ABSTRACT

A display module includes a display panel including a plurality of pixels, a carrier panel on a rear surface of the display panel, and an adhesive layer disposed between the display panel and the carrier panel, where the adhesive layer is in contact with the carrier panel. Lateral surfaces of the adhesive layer are recessed from lateral surfaces of the carrier panel.

7 Claims, 20 Drawing Sheets

DISPLAY MODULE, DISPLAY APPARATUS INCLUDING THE SAME, AND METHOD OF MANUFACTURING THE DISPLAY APPARATUS

This application is a divisional of U.S. patent application Ser. No. 16/843,890, filed on Apr. 9, 2020, which claims priority to Korean Patent Application No. 10-2019-0057676, filed on May 17, 2019, and all the benefits accruing therefrom under 35 U.S.C. § 119, the content of which in its entirety is herein incorporated by reference.

BACKGROUND

1. Field

The disclosure herein relates to a display module, a display apparatus including the display module, and a method of manufacturing the display apparatus, and more particularly, to a display module formed with improved process reliability, a display apparatus including the display module, and a method of manufacturing the display apparatus.

2. Description of the Related Art

A Display device typically includes a display panel for displaying images and an optical member or a window coupled thereto. The display device may be formed through various process steps. In a process of forming a display panel or attaching an optical member or a window to the formed display panel, the display panel may be attached to a carrier panel and go through respective process steps to be prevented from being damaged. Then, the carrier panel is removed or separated from the display panel and the display panel may be shipped as a product.

SUMMARY

The disclosure provides a display module formed with improved process reliability in a process of removing a carrier panel.

The disclosure also provides a display apparatus including the display module.

The disclosure also provides a method of manufacturing a display apparatus, which may simplify the process, improve process reliability, and reduce the cost of the process.

An embodiment of the invention provides a display module including: a display panel including a plurality of pixels; a carrier panel on a rear surface of the display panel; and an adhesive layer disposed between the display panel and the carrier panel, where the adhesive layer is in contact with the carrier panel, in which lateral surfaces of the adhesive layer are recessed from lateral surfaces of the carrier panel.

In an embodiment, a portion of the rear surface of the display panel may be exposed through the adhesive layer.

In an embodiment, the lateral surfaces of the carrier panel may have inclined surfaces with respect to the rear surface of the display panel.

In an embodiment, lateral surfaces of the display panel may be aligned with the inclined surfaces when viewed in cross section.

In an embodiment, the display module may further include a window on a front surface of the display panel, in which lateral surfaces of the window may be aligned with the inclined surfaces when viewed in cross section.

In an embodiment, the display module may further include an additional adhesive layer between the display panel and the window, and a lateral surface of the additional adhesive layer may be aligned with the inclined surfaces when viewed in cross section.

In an embodiment, the adhesive layer may include at least one of an optical clear adhesive, an optical clear resin, or a pressure-sensitive adhesive.

In an embodiment, the display panel may include a polyimide substrate, and the adhesive layer may be in contact with the polyimide substrate.

In an embodiment, the display module may further include a protrusion portion protruding from a rear surface of the carrier panel when viewed on the rear surface of the display panel.

In an embodiment, when viewed on the rear surface of the display panel, the protrusion portion may be disposed along the lateral surfaces of the carrier panel.

In an embodiment of the invention, a display apparatus includes: a display panel including a plurality of pixels; a lower protective panel on a rear surface of the display panel; and an adhesive layer between the display panel and the lower protective panel, in which lateral surfaces of the display panel are inclined from lateral surfaces of the lower protective panel, and a portion of the rear surface of the display panel is exposed through the adhesive layer.

In an embodiment, lateral surfaces of the adhesive layer may be recessed from the lateral surfaces of the display panel.

In an embodiment, the display panel may include a substrate and an organic light-emitting device on the substrate.

In an embodiment, the substrate may include polyimide.

In an embodiment, the lower protective panel may include a metal.

In an embodiment, the display panel may be foldable around a folding axis extending in one direction.

In an embodiment, the display apparatus may further include a window on a front surface of the display panel, in which lateral surfaces of the window may be aligned with the lateral surfaces of the display panel.

In an embodiment, the display apparatus may further include additional layers between the window and the display panel, in which lateral surfaces of the additional layers may be aligned with the lateral surfaces of the display panel.

In an embodiment of the invention, a method of manufacturing a display apparatus includes: providing an initial display module including a display panel, a carrier panel on a rear surface of the display panel, and an adhesive layer disposed between the display panel and the carrier panel, where the adhesive layer is in contact with the carrier panel; cutting the initial display module by emitting a first laser beam along a predetermined cutting line such that first lateral surfaces are formed; processing the adhesive layer by emitting a second laser beam along a predetermined processing line defined on the insides of the first lateral surfaces such that a display module of the display apparatus is formed; removing the carrier panel from the display module; and forming a display apparatus by attaching a lower protective panel on the rear surface of the display panel.

In an embodiment, the second laser beam may have an intensity lower than an intensity of the first laser beam.

In an embodiment, the first lateral surfaces may be inclined with respect to the rear surface of the display panel.

In an embodiment, lateral surfaces of the adhesive layer may be exposed in the cutting of the initial display module, and the second laser beam may be incident at the exposed lateral surfaces of the adhesive layer.

In an embodiment, an adhesive layer of the display module may be defined by a portion of the adhesive layer of the initial display module.

In an embodiment, when the carrier panel is removed, a portion of the adhesive layer, which is in contact with the carrier panel, may be removed.

In an embodiment, the first laser beam may form a protrusion portion on a rear surface of the carrier panel.

BRIEF DESCRIPTION OF THE FIGURES

These and/or other features of the invention will become apparent and more readily appreciated from the following description of embodiments, taken in conjunction with the accompanying drawings, in which.

DETAILED DESCRIPTION

Figure 1A:
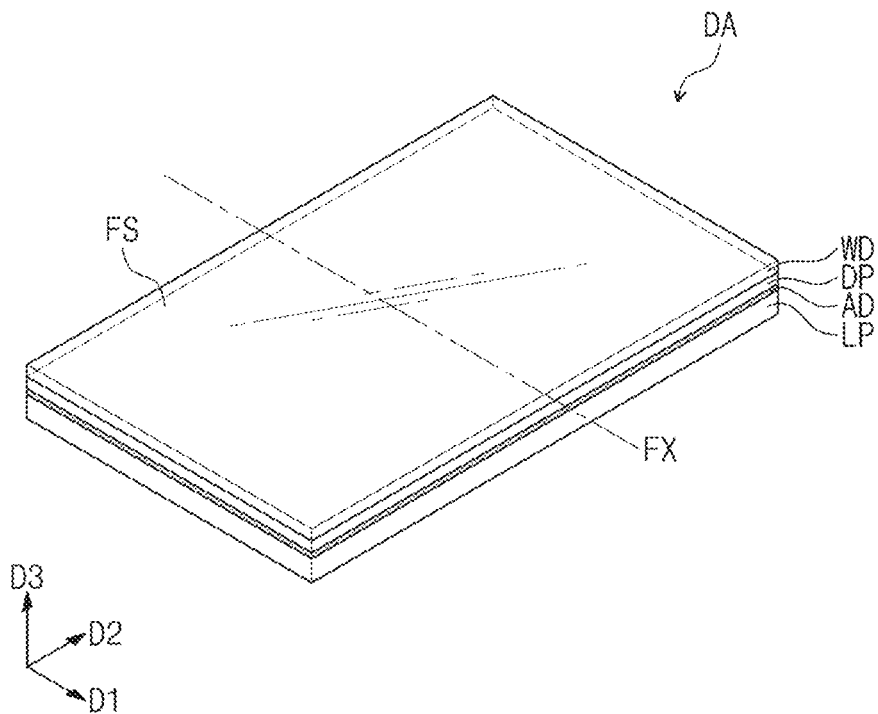
FIGS. 1A and 1B are perspective views of a display apparatus in accordance with an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on", "connected to" or "coupled to" another element or layer, it can be directly on, connected or coupled to the other element or layer or intervening elements or layers may be present therebetween. In contrast, when an element or layer is referred to as being "directly on", "directly connected to" or "directly coupled to" another element or layer, there are no intervening elements or layers present.

Like reference numeral refer to like elements throughout. Further, in the drawings, the thickness, the ratio, and the dimension of the element are exaggerated for effective description of the technical contents.

As used herein, the term "and/or" includes any and all combinations of one or more of the associated listed items. "Or" means "and/or." The term "at least one of" modifying listed elements means "at least one selected from" the listed elements.

It will be understood that, although the terms first, second, etc. may be used herein to describe various elements, these elements should not be limited by these terms. These terms are only used to distinguish one element from another. For example, a first element discussed below could be termed a second element without departing from the teachings of the invention, and, similarly, the second element could also be termed the first element. As used herein, the singular forms, "a", "an" and "the" are intended to include the plural forms, including "at least one," unless the context clearly indicates otherwise.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which this invention belongs. It should be further understood that terms, such as those defined in commonly used dictionaries, should be interpreted as having a meaning that is consistent with their meaning in the context of the relevant art and are will not be interpreted in an idealized or overly formal sense unless expressly so defined herein.

It will be understood that the terms "comprises" and/or "comprising," or "includes," and/or "including", when used in this specification, specify the presence of stated features, integers, steps, operations, elements, components and/or combinations thereof, but do not preclude the presence or addition of one or more other features, integers, steps, operations, elements, components, and/or combinations thereof.

Hereinafter, embodiments of the invention will be described in detail with reference to the accompanying drawings.

Figure 1B:
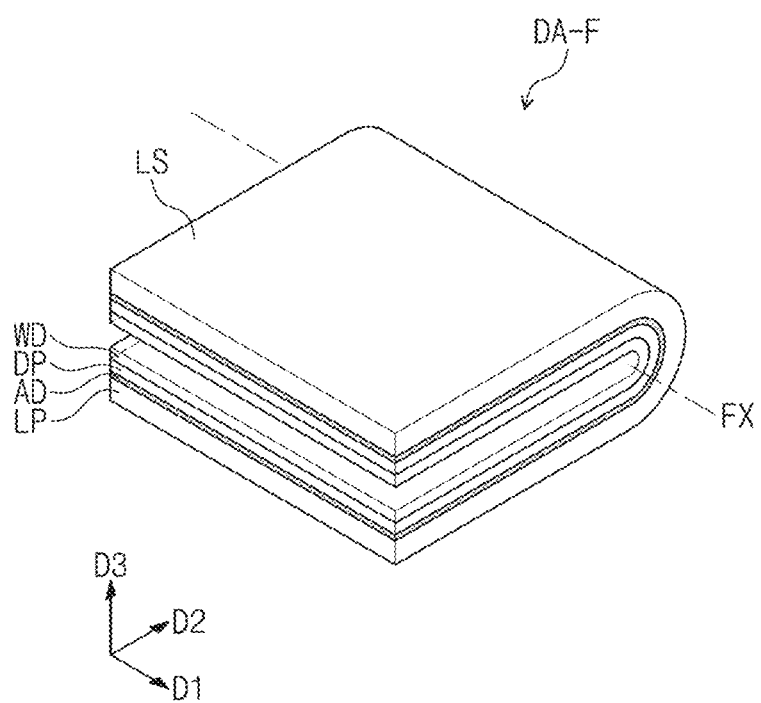
Figure 2A:
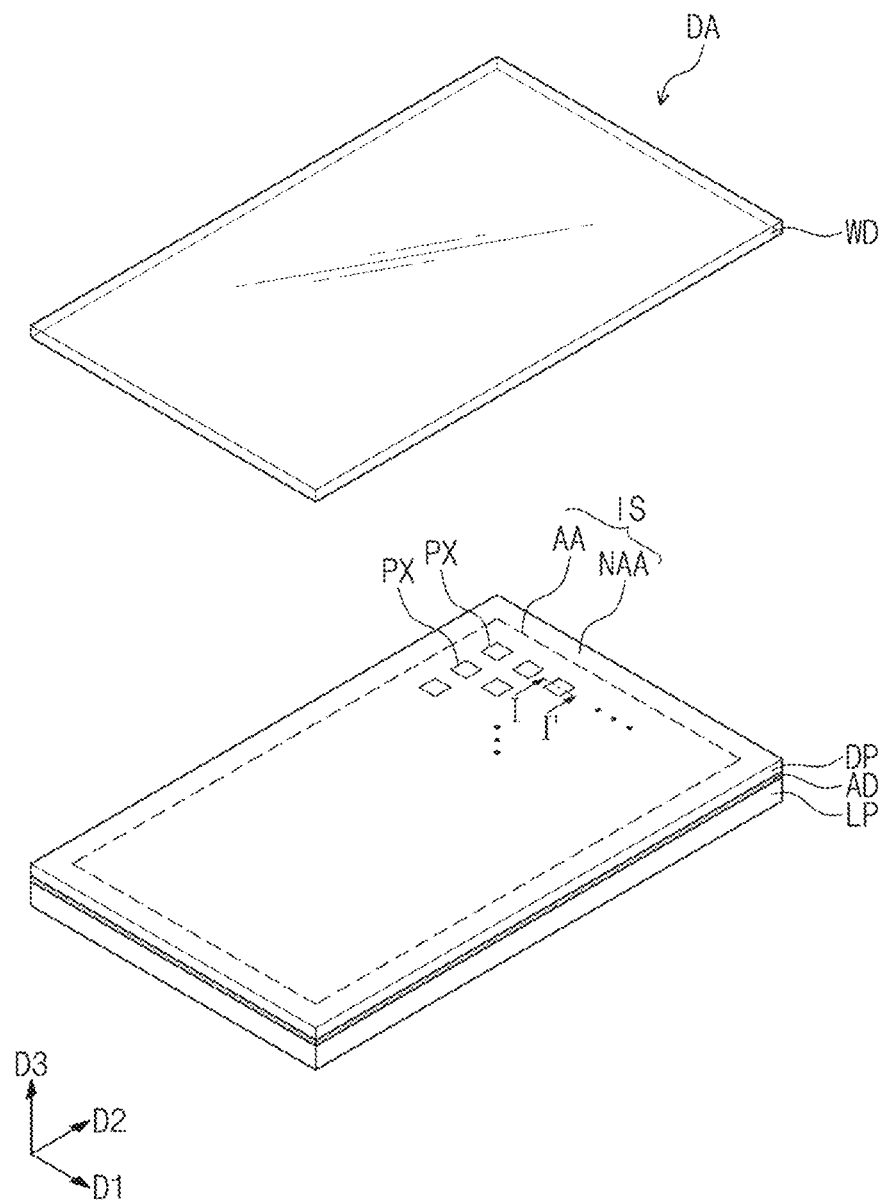
FIG. 2A is an exploded perspective view of the display apparatus illustrated in FIG. 1A.
Figure 2B:
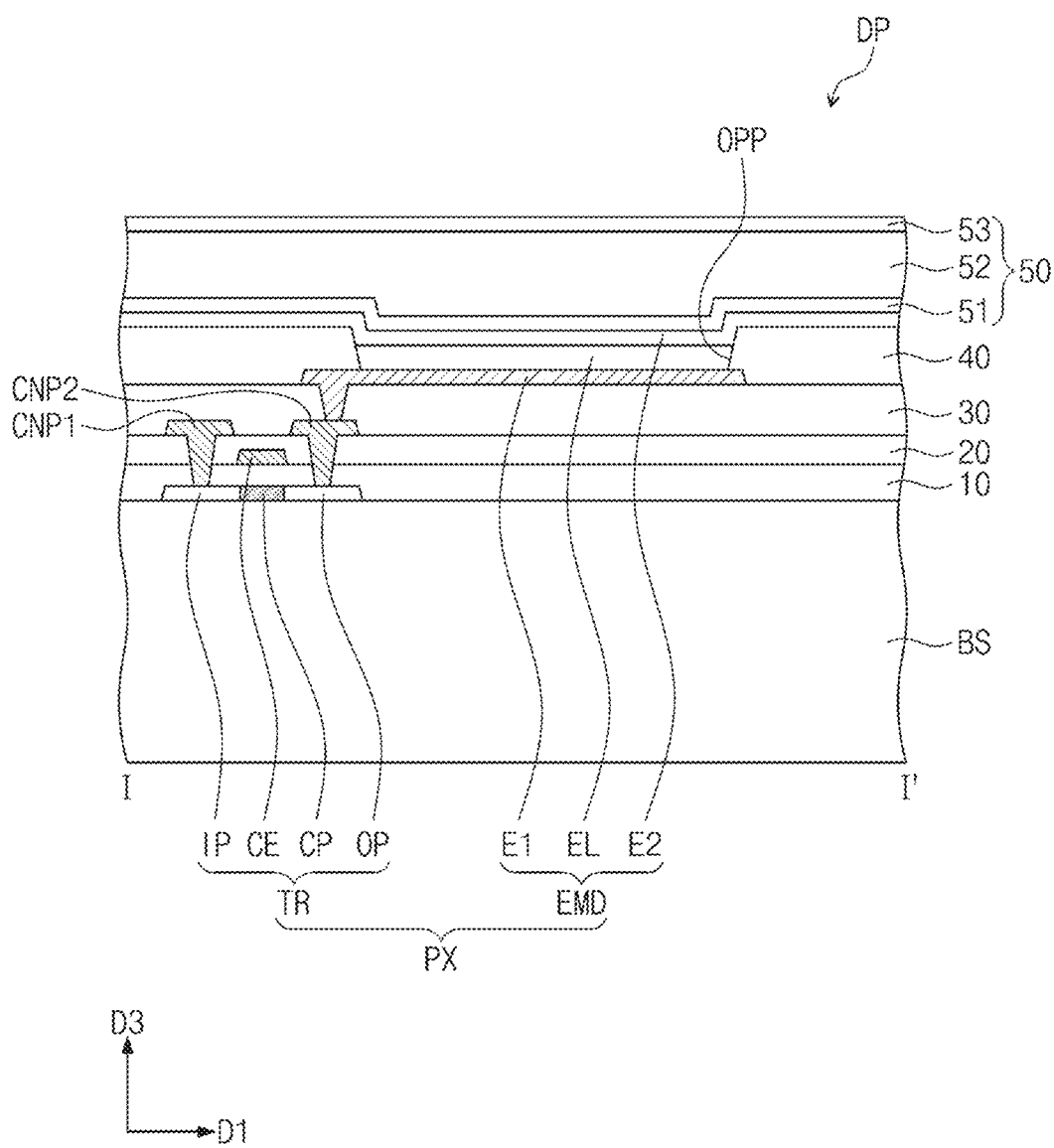
FIG. 2B is a cross-sectional view of the display panel taken along line I-I' illustrated in FIG. 2A.
Figure 3A:
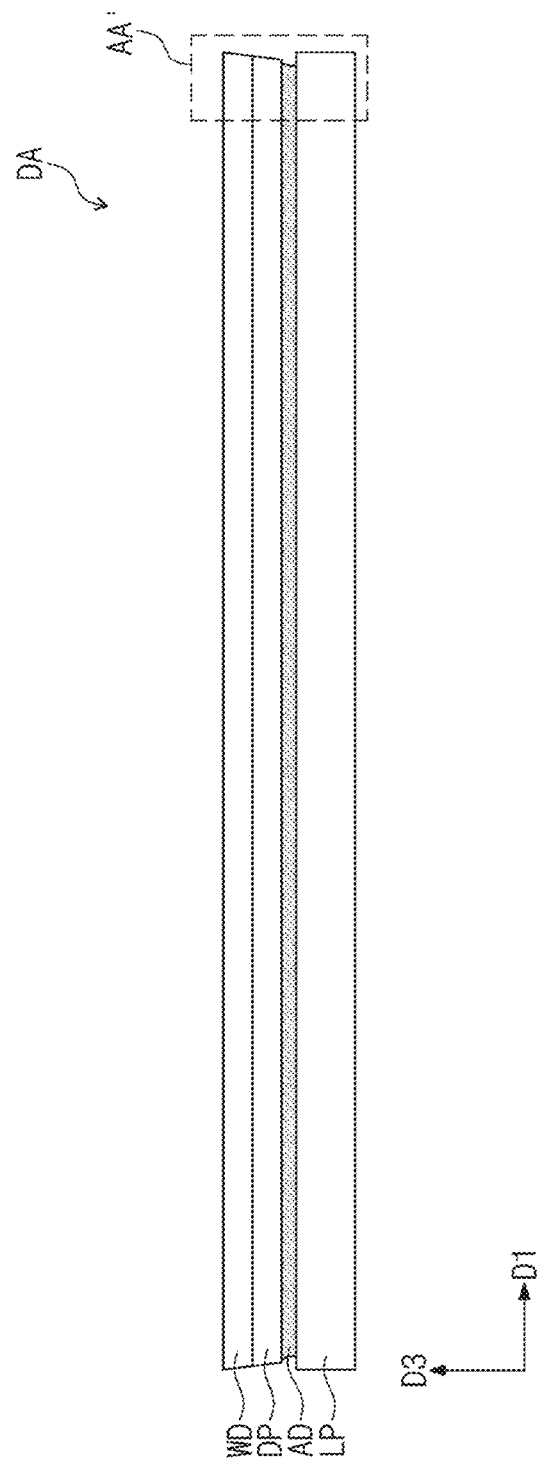
FIG. 3A is a side view of the display apparatus illustrated in FIG. 1A.
Figure 3B:
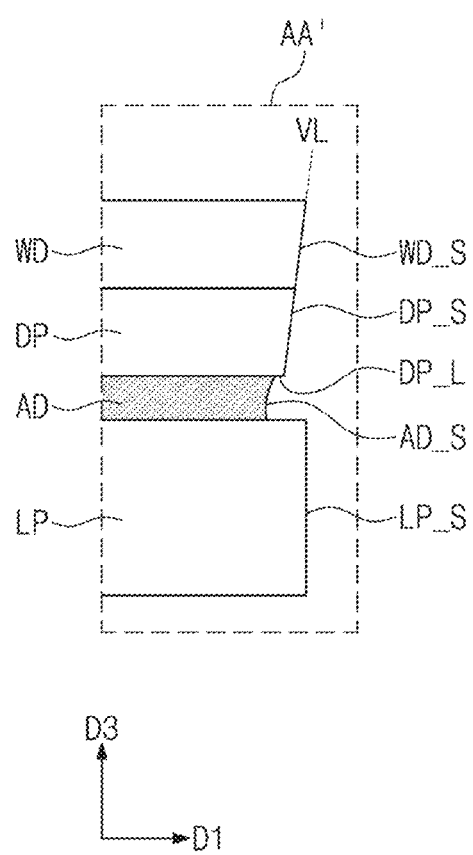
FIG. 3B is an enlarged side view of region AA' of FIG. 3A.

FIGS. 1A and 1B are perspective views of a display apparatus in accordance with an embodiment of the invention. FIG. 2A is an exploded perspective view of the display apparatus illustrated in FIG. 1A. FIG. 2B is a cross-sectional view of the display panel taken along line I-I' illustrated in FIG. 2A. FIG. 3A is a side view of the display apparatus illustrated in FIG. 1A. FIG. 3B is an enlarged side view of region AA' of FIG. 3A. Hereinafter, an embodiment of the invention will be described with reference to FIGS. 1A to 3B.

A display apparatus DA is parallel to a plane defined by a first direction D1 and a second direction D2 and has a thickness defined in a third direction D3 perpendicular to the first direction D1 and the second direction D2. The display apparatus DA may be folded around a folding axis FX extending in a predetermined direction. FIG. 1A depicts the display apparatus DA in an unfolded state, and FIG. 1B illustrates a display apparatus DA-F in a folded state.

In an embodiment, as shown in FIG. 1A, the folding axis FX may extend in the first direction D1. The folding axis FX is defined on a front surface FS of the display apparatus DA.

The display apparatus DA may have, in the folded state, the front surface FS covered and a rear surface LS externally exposed by being folded to surround the folding axis FX. Herein, a surface of the display apparatus DA on which an image is displayed may be defined as the front surface FS, and a surface opposite to the front surface FS may be defined as the rear surface LS. In an embodiment, as described above, the folding axis FX may be defined on the front surface FS of the display apparatus DA, but not being limited thereto. Alternatively, the folding axis FX of the display apparatus DA may be defined on the rear surface LS. In such an embodiment, the display apparatus DA may have, in the folded state, the front surface FS externally exposed, but is not limited to any one embodiment.

Referring to FIG. 2A, an embodiment of the display apparatus DA includes a window WD, a display panel DP, an adhesive layer AD, and a lower protective panel LP. The window WD is disposed on the display panel DP to protect a front surface IS of the display panel DP. The window WD is optically transparent and has insulating properties. In one embodiment, for example, the window WD may include a glass, a plastic, or a film.

The display panel DP may receive an electrical signal and display an image on the front surface IS. The image, displayed by the display panel DP, may be visible to the user through the window WD. The front surface IS includes an active area AA and a peripheral area NAA adjacent to the active area AA.

The display panel DP may include a plurality of pixels PX. The pixels PX are disposed in the active area AA to display predetermined lights. The lights, generated by the pixels PX, are collected to provide an image.

Referring to FIG. 2B, an embodiment of the display panel DP may include a substrate BS, a pixel PX, and a plurality of insulating layers 10, 20, 30, 40, and 50. The substrate BS has insulating properties. In such an embodiment, the substrate BS may be flexible to allow the display panel DP to be foldable. In one embodiment, for example, the substrate BS may be a glass substrate, a polymer substrate including at least one selected from polyethylene terephthalate ("PET"), polycarbonate ("PC"), polymethyl methacrylate ("PMMA"), polyimide ("PI") and the like, or a polymer film.

The insulating layers 10, 20, 30, 40, and 50 may include first, second, third, fourth, and fifth insulating layers 10, 20, 30, 40, and 50 that are sequentially stacked one on another in a thickness direction thereof. Each of the first to fifth insulating layers 10 to 50 may include an organic and/or inorganic material.

In an embodiment, the pixel PX is disposed on the substrate BS. In such an embodiment, as shown in FIG. 2B, the pixel PX includes a thin-film transistor TR and a light-emitting device EMD, for example. In an alternative embodiment, the pixel PX may include a plurality of thin-film transistors TR or other electronic device such as a capacitor, but is not limited to any one embodiment.

The thin-film transistor TR may include a channel portion CP, an input portion IP, an output portion OP, and a control electrode CE. The channel portion CP, the input portion IP, and the output portion OP may be portions of a single semiconductor pattern that are disposed between the substrate BS and the first insulating layer 10. The channel portion CP, the input portion IP, and the output portion OP contain a semiconductor material. In one embodiment, for example, the channel portion CP, the input portion IP, and the output portion OP may include a polysilicon or oxide semiconductor.

The channel portion CP may be a portion of the semiconductor pattern that overlaps with the control electrode CE. The control electrode CE may be disposed between the first insulating layer 10 and the second insulating layer 20 and may be disposed to be spaced apart from the channel portion CP when viewed in cross section. The input portion IP and the output portion OP may be portions that are spaced apart from each other with the channel portion CP therebetween and that correspond to opposing ends of the semiconductor pattern.

Each of the input portion IP and the output portion OP may have relatively higher conductivity than the channel portion CP. In one embodiment, for example, the input portion IP and the output portion OP may further include metal materials as compared to the channel portion CP or may have a dopant concentration higher than that of the channel portion CP.

In an embodiment, the display panel DP may further include first and second connection electrodes CNP1 and CNP2. The first and second connection electrodes CNP1 and CNP2 are disposed between the second insulating layer 20 and the third insulating layer 30 and disposed to be spaced apart from each other when viewed in a plan view.

The first connection electrode CNP1 is connected to the input portion IP to provide an electrical signal to the input portion IP. The second connection electrode CNP2 connects the output portion OP to the light-emitting device EMD. The second connection electrode CNP2 is connected to the output portion OP to transmit an electrical signal, which is outputted from the output portion OP, to the light-emitting device EMD.

In an embodiment, as shown in FIG. 2B, the channel portion CP, the input portion IP and the output portion OP may define the semiconductor pattern having an integral shape. In an alternative embodiment, the input portion IP and the output portion OP may be provided as separate conductive patterns that are spaced apart from the channel portion CP. In such an embodiment, the first and second connection electrodes CNP1 and CNP2 may serve as an input electrode and an output electrode that respectively correspond to the input portion IP and the output portion OP In an embodiment, the thin-film transistor TR may be variously modified to be in one of various structures, but is not limited to any one embodiment.

The light-emitting device EMD is disposed on the third insulating layer 30. The light-emitting device EMD may include a first electrode E1, a second electrode E2, and a light-emitting layer EL.

The first electrode E1 is disposed between the third insulating layer 30 and the fourth insulating layer 40. The first electrode E1 may pass through the third insulating layer 30 and be connected to the thin-film transistor TR through the second connection electrode CNP2.

The light-emitting layer EL is disposed on the first electrode E1. The light-emitting layer EL may be disposed in an opening portion OPP that is defined in the fourth insulating layer 40. The opening portion OPP exposes at least a portion of the first electrode E1. The opening portion OPP is disposed in the active area AA to define a light-emitting area. Light, generated by the pixel PX, may be displayed through the opening portion OPP.

The second electrode E2 is disposed on the light-emitting layer EL. In an embodiment, as shown in FIG. 2B, the second electrode E2 may be provided in an integral shape that overlaps with the entirety of the active area AA, for example. In an alternative embodiment, the second electrode E2 of the light-emitting device EMD may be provided as a pattern that corresponds to the first electrode E1, but is not limited to any one embodiment.

The fifth insulating layer 50 is disposed on the fourth insulating layer 40 to cover the light-emitting device EMD. The fifth insulating layer 50 may include a first inorganic layer 51, an organic layer 52, and a second inorganic layer 53. The first inorganic layer 51 is disposed on the second electrode E2 to cover the second electrode E2. The first inorganic layer 51 may include an inorganic material. The first inorganic layer 51 protects the second electrode E2 from external moisture or air.

The organic layer 52 is disposed on the first inorganic layer 51. The organic layer 52 may have a relatively great thickness as compared to the first inorganic layer 51. The organic layer 52 may include an organic material. The organic layer 52 may planarize a layer therebelow, e.g., an upper surface of the first inorganic layer 51 to provide a flat surface on an upper side thereof.

The second inorganic layer 53 is disposed on the organic layer 52 to cover the organic layer 52. The second inorganic layer 53 encapsulates the organic layer 52. The fifth insulating layer 50 described above is merely exemplary. In an alternative embodiment, at least one of the first inorganic layer 51, the organic layer 52, or the second inorganic layer 53 may be provided in plural or may be disposed alternately with each other, but is not limited to any one embodiment.

Referring back to FIG. 2A, a lower protective panel LP is disposed on a rear surface of the display panel DP to cover or protect the rear surface of the display panel DP. The lower protective panel LP may have relatively high strength as compared to the display panel DP. In one embodiment, for example, the lower protective panel LP may include a metal, an alloy, a tempered glass, or a plastic. Alternatively, the lower protective panel LP may have high elasticity as compared to the display panel DP. In one embodiment, for example, the lower protective panel LP may include a rubber, urethane, or a foam resin. The lower protective panel LP may improve reliability of the display apparatus DA by effectively preventing an external impact, applied from a lower side of the display panel DP, from being transmitted to the display panel DP.

The adhesive layer AD is disposed between the lower protective panel LP and the display panel DP to physically bond the lower protective panel LP to the display panel DP. The adhesive layer AD may have a predetermined adhesion. The adhesive layer AD may include at least one of, for example, an optical clear adhesive ("OCA"), an optical clear resin ("OCR") or a pressure-sensitive adhesive ("PSA").

Referring to FIGS. 3A and 3B, lateral surfaces AD_S of the adhesive layer AD of the display apparatus DA may be defined to be disposed further inwardly than lateral surfaces WD_S of the window WD and lateral surfaces DP_S of the display panel DP or lateral surfaces LP_S of the lower protective panel LP. In an embodiment, as shown in FIG. 3B, the lateral surfaces AD_S of the adhesive layer AD are defined to be disposed further inwardly than a virtual (or imaginary) line VL that is defined along the lateral surfaces WD_S of the window WD and the lateral surfaces DP_S of the display panel DP and are defined to be disposed further inwardly than lateral surfaces LP_S of the lower protective panel LP. In such an embodiment, the lateral surfaces AD_S of the adhesive layer AD may be recessed with respect to the virtual line VL or the lateral surfaces LP_S of the lower protective panel LP.

In an embodiment, a portion of the rear surface DPL of the display panel DP may be exposed through the adhesive layer AD by not being covered by the adhesive layer AD. As the extent that the lateral surfaces AD_S of the adhesive layer AD are recessed from the virtual line VL increases, the area of the portion, exposed through the adhesive layer AD, the rear surface DP_L of the display panel DP may be increased. The adhesive layer AD shown in the drawings is merely exemplary, and not being limited thereto. Alternatively, the adhesive layer AD including the recessed lateral surfaces AD_S may be disposed to cover the front surface of the display panel DP, but not being limited to any one embodiment.

In an embodiment, the lateral surfaces DP_S of the display panel DP and the lateral surfaces WD_S of the window WD of the display apparatus DA may be inclined with respect to the third direction D3, as shown in FIG. 3B, where the virtual line VL is illustrated as extending in a diagonal direction inclined with respect to the third direction D3 and the first direction D1. The lateral surfaces DP_S of the display panel DP and the lateral surfaces WD_S of the window WD of the display apparatus DA will be described later in greater detail.

The lateral surfaces LP_S of the lower protective panel LP may not be aligned with the lateral surfaces DP_S of the display panel DP and the lateral surfaces WD_S of the window WD. In an embodiment, as shown in FIG. 3B, the lateral surfaces LP_S of the lower protective panel LP may be parallel to the third direction D3. The lateral surfaces LP_S of the lower protective panel LP described above with reference to FIG. 3B are merely exemplary. Alternatively, the lateral surfaces LP_S of the lower protective panel LP may be provided to be aligned with the lateral surfaces DP_S of the display panel DP and the lateral surfaces WD_S of the window WD, but not being limited to any one embodiment.

FIGS. 4A to 4L are cross-sectional views illustrating a method of manufacturing a display apparatus in accordance with an embodiment of the invention. An embodiment of the invention will be described with reference to FIGS. 4A to 4L. The same or like elements or components as those described above with reference to FIGS. 1A to 3B are denoted by the same or like reference numerals, and any repetitive detailed description thereof will be omitted.

Figure 4A:
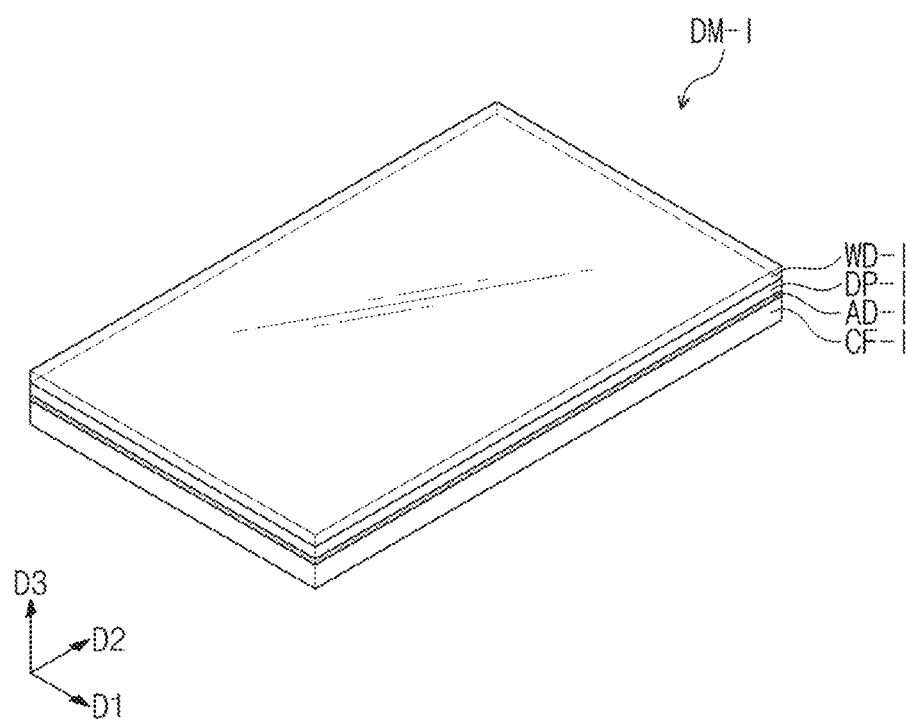
FIGS. 4A to 4L are cross-sectional views illustrating a method of manufacturing a display apparatus in accordance with an embodiment of the invention.

In an embodiment, as illustrated in FIG. 4A, an initial display module DM-I is provided. The initial display module DM-I may include an initial display panel DP-I, an initial window WD-I, an initial adhesive layer AD-I, and an initial carrier panel CF-I. The initial display module DM-I may partially correspond to the display apparatus DA (see FIG. 2A) illustrated in FIG. 2A.

In such an embodiment, the initial display panel DP-I and the initial window WD-I may correspond to the display panel DP and the window WD that are illustrated in FIG. 2A, except for the shapes (areas) thereof when viewed in a plan view. Hereinafter, any repetitive detailed description thereof will be omitted.

The initial display module DM-I may include the initial carrier panel CF-I instead of the lower protective panel LP (see FIG. 2A), as compared to the display apparatus DA. The initial carrier panel CF-I may be bonded to the initial display panel DP-I by the initial adhesive layer AD-I. The initial carrier panel CF-I prevents damage that may occur on the initial display panel DP-I due to movement or the like during a process. In one embodiment, for example, the initial carrier panel CF-I may include an insulating film.

Figure 4B:
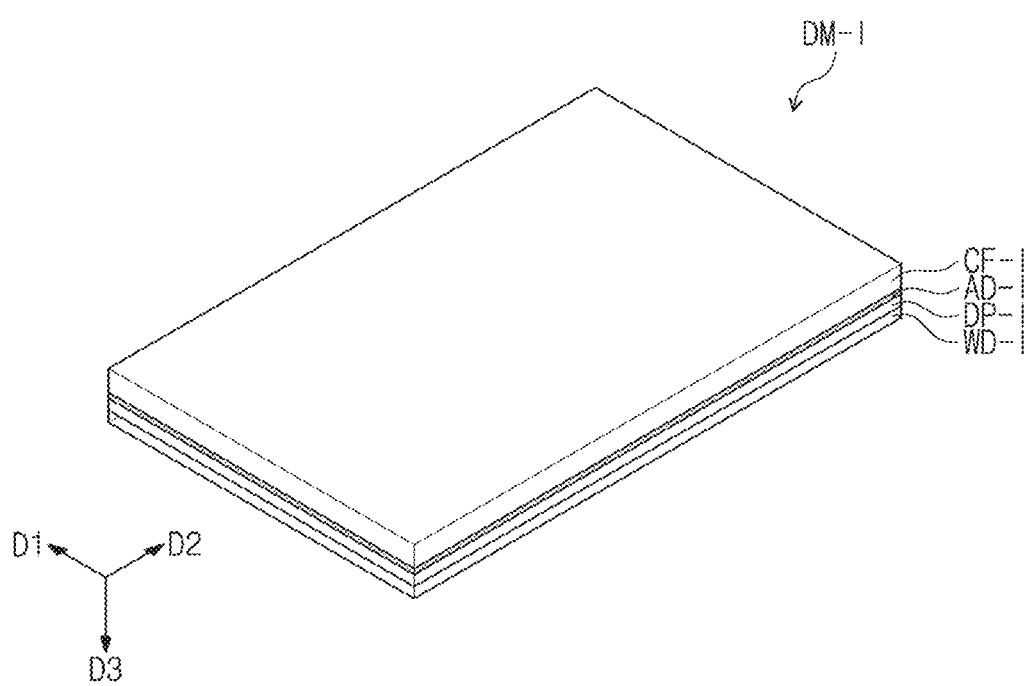

Then, as illustrated in FIG. 4B, the initial display module DM-I is rotated. The initial display module DM-I may be rotated about 180° with respect to an axis that is oriented in the second direction D2 to be disposed in a way such that the initial carrier panel CF-I faces upward.

Figure 4C:
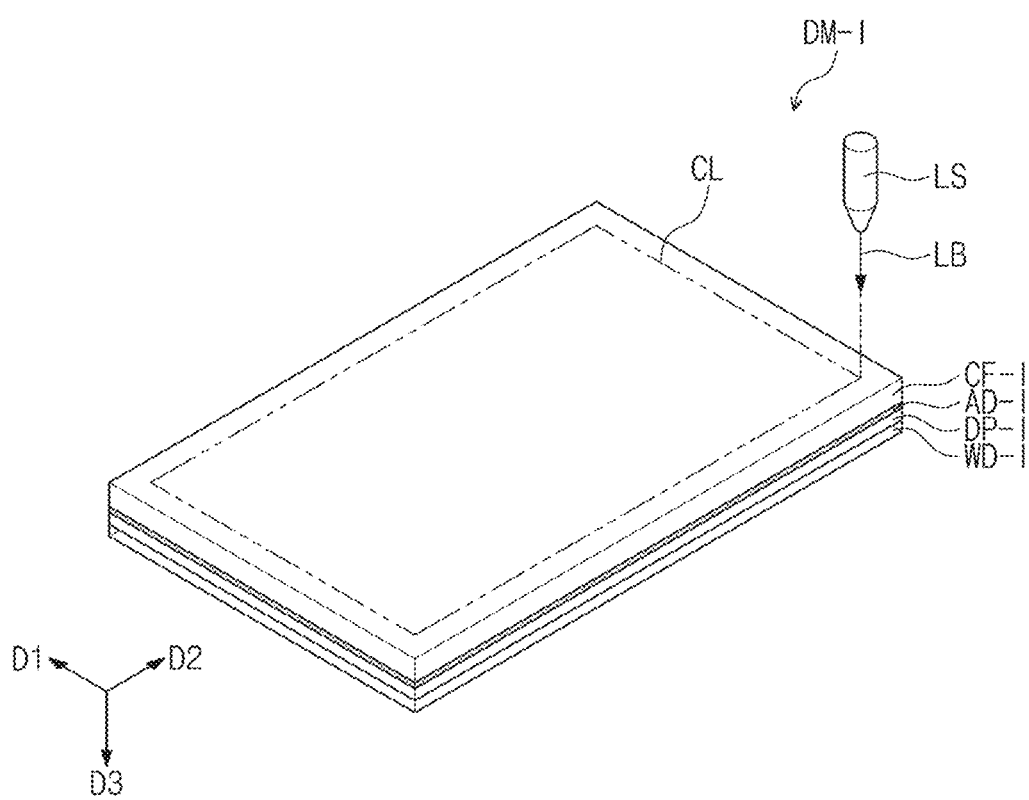
Figure 4D:
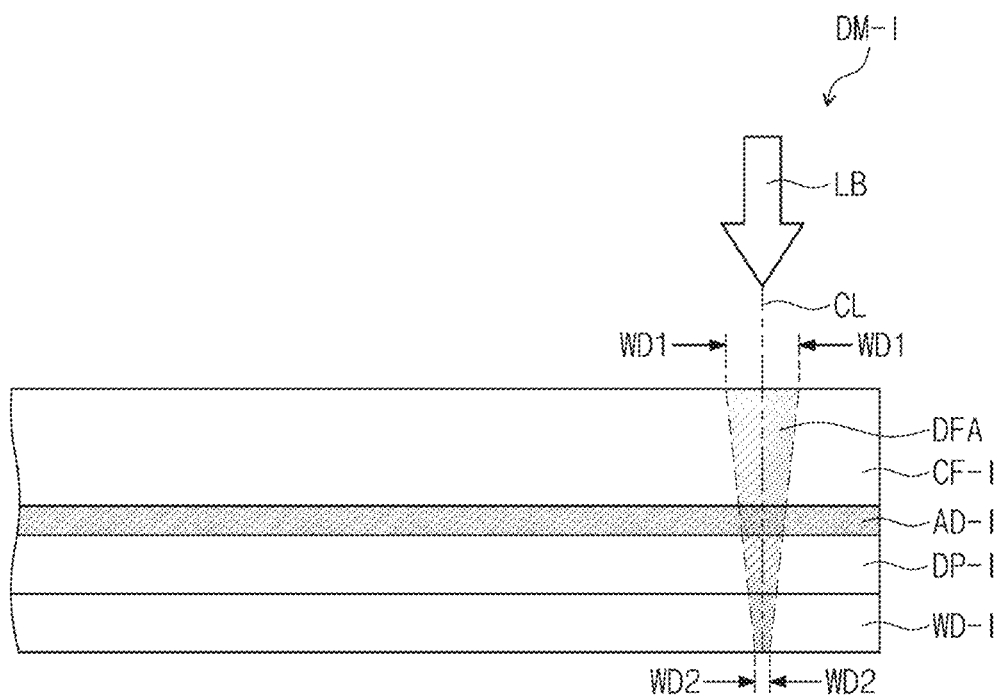
Figure 4E:
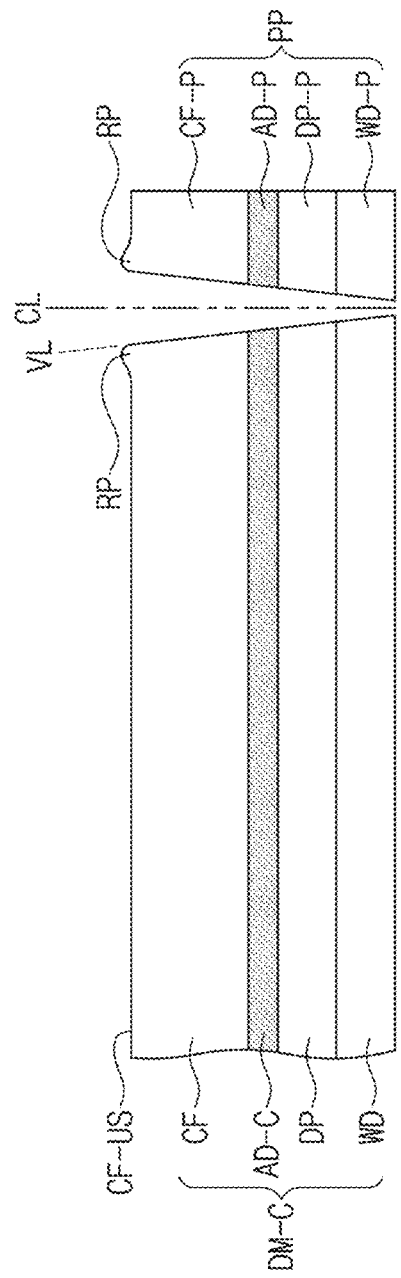

Then, as illustrated in FIGS. 4C to 4E, a cut display module DM-C is formed through cutting the initial display module DM-I. In an embodiment, as illustrated in FIG. 4C, the initial display module DM-I is cut into a predetermined size along a virtual cutting line CL defined on the initial carrier panel CF-I. In such an embodiment, the cutting of the initial display module DM-I may be performed by using a laser beam LB.

In an embodiment, as illustrated in FIG. 4D, when the laser beam LB is emitted from a laser emitter LS to the initial display module DM-I, deformation may occur in a portion of the initial display module DM-I, in which the laser beam LB is absorbed. FIG. 4D illustrates, by shading, an area DFA in which the deformation has occurred (hereinafter referred to as an area DFA), for ease of description. The deformation, generated by the laser beam LB, may include melting.

In this case, the area DFA may have a width decreasing in the thickness direction (for example, the third direction D3) as the area DFA goes away from the laser beam LB when viewed in cross section. With regard to the initial display module DM-I, the deformation may occur in the widest area of the initial carrier panel CF-I onto which the laser beam LB is first incident and which is exposed to the laser beam LB for a long period of time, and the deformation may occur in the narrowest area of the initial window WD-I which the laser beam LB reaches last and which is exposed to the laser beam LB for a relatively short period of time. Thus, the area DFA may have an inverted triangular shape or an inverted trapezoidal shape when viewed in cross section, as shown in FIG. 4D.

As a result, as illustrated in FIG. 4E, when the cutting is completed, the area DFA is removed, and the cut display module DM-C and an edge portion PP including an edge window portion WD-P, an edge display panel portion DP-P, an edge adhesive layer portion AD-P and an edge carrier panel portion CF-P may be separated from each other. A cut display module DM-C may be formed by removing the area DFA from the initial carrier panel CF-I, the initial adhesive layer AD-I, the initial display panel DP-I, and the initial window WD-I and by separating the edge portion PP, and the cut display module DM-C includes a carrier panel CF, an adhesive layer (hereinafter, also referred to as the cut adhesive layer) AD-C, the display panel DP and the window WD, which are cut.

When viewed in cross section, the width of the area DFA varies in the thickness direction. As illustrated in FIGS. 4D and 4E, the greatest width WD1 (hereinafter referred to as a first width WD1) of the area DFA may be defined on a rear surface CF-US of the carrier panel CF. The smallest width WD2 (hereinafter referred to as a second width WD2) of the area DFA may be defined on a lower surface of the window WD. As described above, a difference in emission amount and time of the laser beam LB causes the first width WD1 to be greater than the second width WD2. In an embodiment, the first width WD1 may be about 100 micrometers (µm), for example.

A lateral surface of the cut display module DM-C may be formed to be inclined with respect to the thickness direction (for example, the third direction D3) due to the shape of the area DFA. Lateral surfaces of the carrier panel CF, the cut adhesive layer AD-C, the display panel DP and the window WD may be exposed when viewed on the rear surface CF-US of the carrier panel CF.

In such an embodiment, the rear surface CF-US of the carrier panel CF may have a predetermined protrusion portion RP formed thereon. The protrusion portion RP may be formed along an edge of an area on which the laser beam LB is incident, that is, along the edge of the area DFA. As the laser beam LB is incident on the initial carrier panel CF-I, plastic deformation may occur on the initial carrier panel CF-I. Thus, a portion of the rear surface CF-US of the carrier panel CF may be deformed into a curved shape to form a curved protrusion portion RP. The protrusion portion RP described above with reference to FIG. 4E is merely exemplary. The protrusion portion RP of the cut display module DM-C may be formed depending on the intensity and emission time of the laser beam LB or a material of the initial carrier panel CF-I, but is not limited to any one embodiment.

Figure 4F:
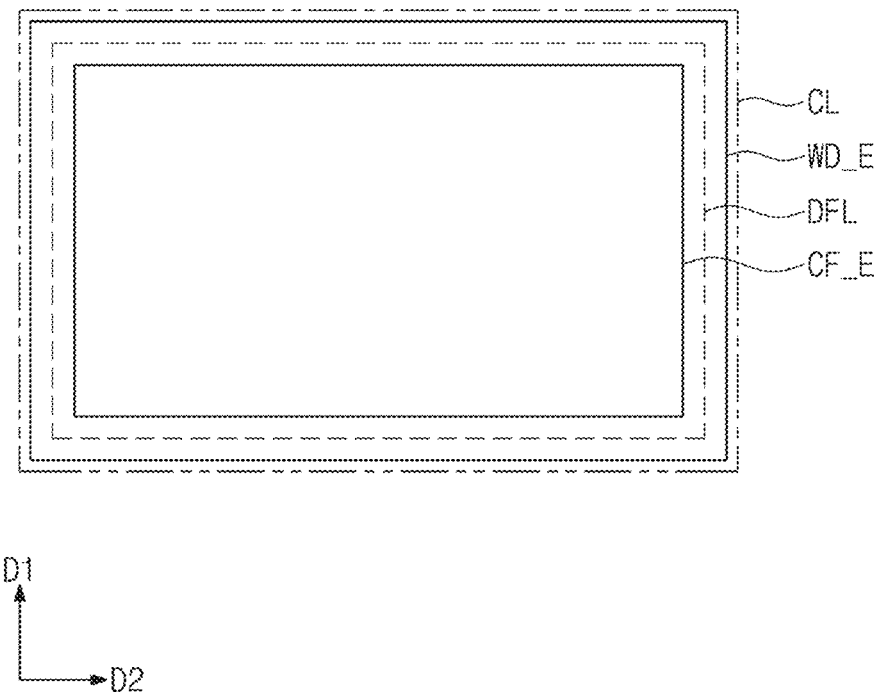
Figure 4G:
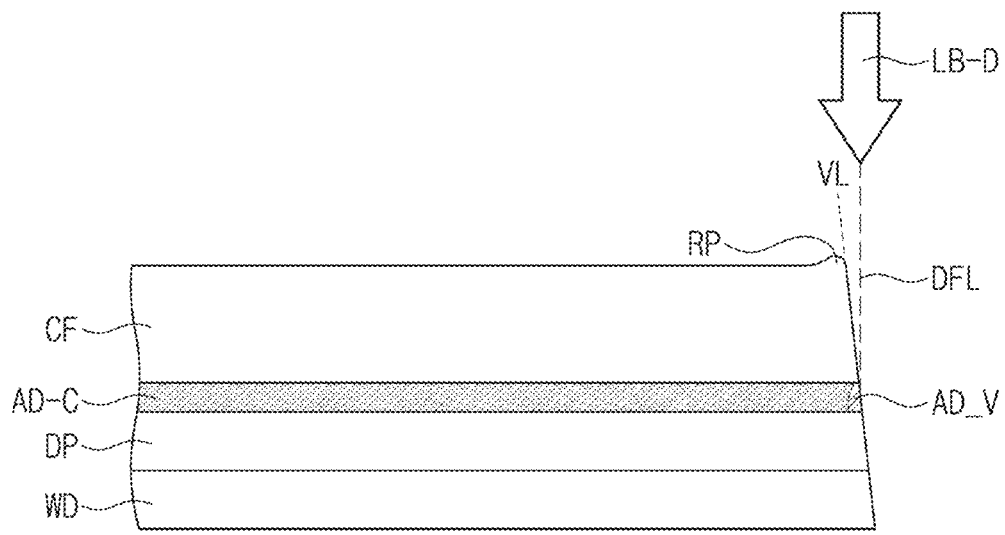
Figure 4H:
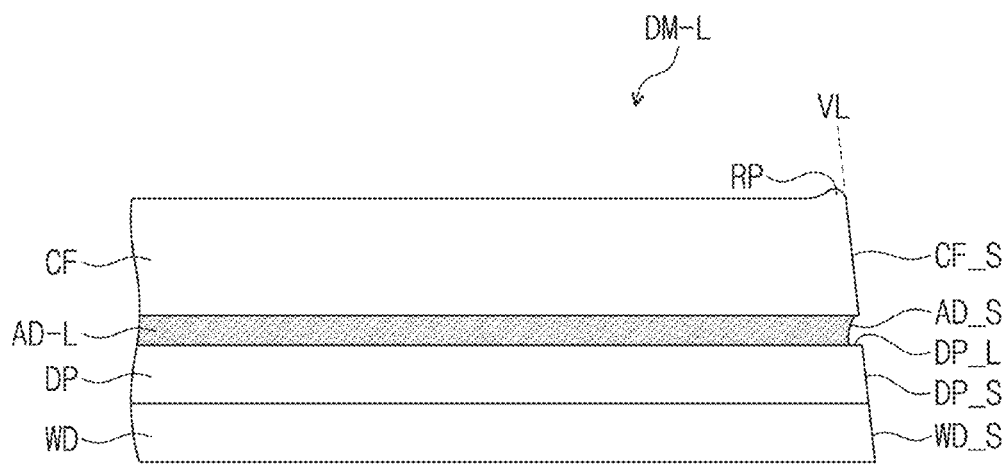

In such an embodiment, as illustrated in FIGS. 4F to 4H, a display module DM-L (hereinafter referred to as a processed display module DM-L) is formed by emitting an additional laser beam LB-D (hereinafter, referred to as the laser beam LB-D) at the cut display module DM-C. The processed display module DM-L may include an adhesive layer AD-L (hereinafter also referred to as a processed adhesive layer AD-L) formed by processing the adhesive layer AD-C of the cut display module DM-C.

In an embodiment, as illustrated in FIGS. 4F and 4G, the laser beam LB-D is emitted along a virtual processing line (or referred to processing line) DFL that is defined on the cut display module DM-C. The virtual processing line DFL may be defined further inside than the virtual cutting line CL and may be defined between an end CF_E of the carrier panel CF and an end WD_E of the window WD. The lateral surface of the cut display module DM-C is formed as an inclined surface along the virtual line VL, and thus the end CF_E of the carrier panel CF positioned uppermost and the end WD_E of the window WD positioned lowermost may be viewed while being spaced apart from each other when viewed in a plan view.

The end CF_E of the carrier panel CF in a plan view is a portion in which the protrusion portion RP is formed, and may correspond to the end of the rear surface CF-US of the carrier panel CF. The end WD_E of the window WD in a plan view may correspond to an end of a rear surface of the window WD. In an embodiment, the end WD_E of the window WD may be defined inside the virtual cutting line CL as shown in FIG. 4F. However, the end WD_E of the window WD described above with reference to FIG. 4F is merely exemplary. Alternatively, the end WD_E of the window WD may be defined to substantially match the virtual cutting line CL, but is not limited to any one embodiment.

The virtual processing line DFL may be defined along a lateral surface of the adhesive layer AD-C that is substantially cut. The lateral surface of the cut display module DM-C is formed as the inclined surface along the virtual line VL, and thus the lateral surface of the cut adhesive layer AD-C may be seen or exposed when viewed on the rear surface CF-US of the carrier panel CF. The laser beam LB-D is substantially incident at the lateral surface of the cut adhesive layer AD-C and may generate a deformation area AD_V in a portion of the cut adhesive layer AD-C.

In such an embodiment, the laser beam LB-D may be provided in an environment of relatively low intensity or less emission time as compared to the laser beam LB used in the cutting. The deformation area AD_V may only be formed in the portion of the cut adhesive layer AD-C, which is a single layer, by controlling the intensity and emission time of the laser beam LB-D.

Then, the processed adhesive layer AD-L, having a concave lateral surface AD_S, is formed by removing the deformation area AD_V from the cut adhesive layer AD-C.

Depending on the extent that the lateral surface AD_S of the processed adhesive layer AD-L is concave, at least a portion of a rear surface DP_L of the display panel DP may be exposed.

In the processed display module DM-L, the lateral surface CF_S of the carrier panel CF, the lateral surface DP_S of the display panel DP and the lateral surface WD_S of the window WD may be aligned along the virtual line VL when viewed in cross section, and the lateral surface AD_S of the processed adhesive layer AD-L may be recessed from the lateral surface of the processed display module DM-L. The lateral surface AD_S of the processed adhesive layer AD-L may be recessed from the lateral surface CF_S of the carrier panel CF, the lateral surface DP_S of the display panel DP, and the lateral surface WD_S of the window WD and may have a concave shape with respect to the virtual line VL when viewed in cross section.

Figure 4I:
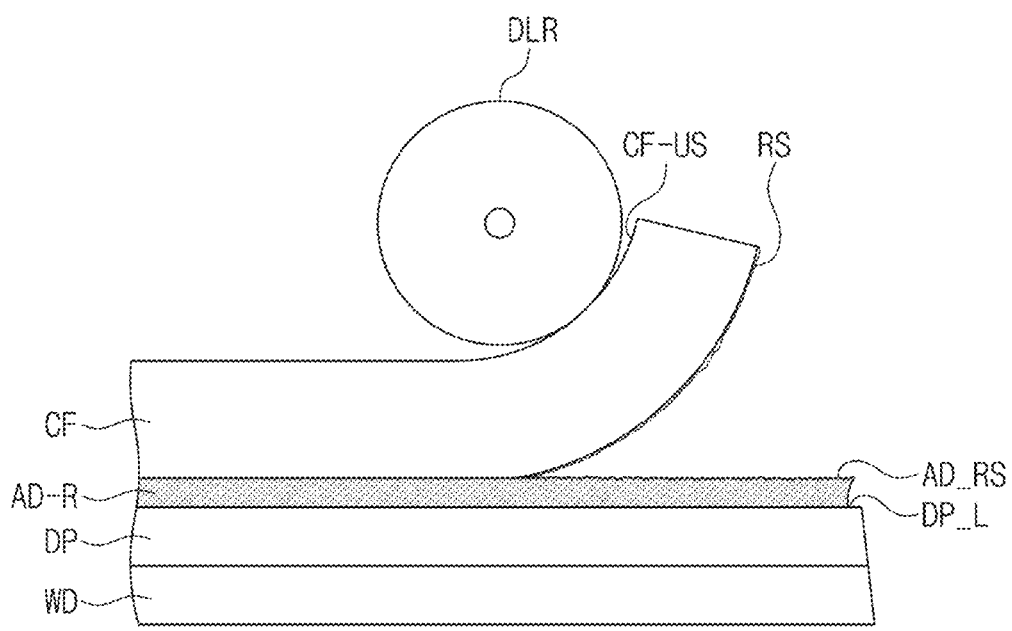
Figure 4J:
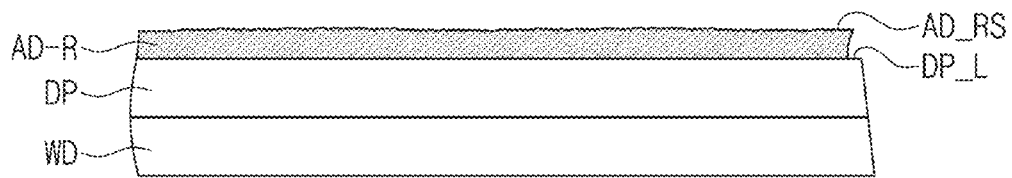

Then, as illustrated in FIGS. 4I and 4J, the carrier panel CF is removed from the processed display module DM-L. In an embodiment, the carrier panel CF may be removed by attaching a delamination roller DLR to the rear surface CF-US of the carrier panel CF.

In accordance with an embodiment of the invention, the lateral surface AD_S of the processed adhesive layer AD-L is recessed further than the lateral surface DP_S of the display panel DP, and thus adhesion between the carrier panel CF and the display panel DP on the lateral surface of the processed display module DM-L may be reduced. The adhesion of an adhesive layer AD-L may be reduced and the carrier panel CF may be delaminated more easily by deforming and removing a portion of the adhesive layer AD-C at the edge of the processed display module DM-L at which the carrier panel CF starts to delaminate.

In an embodiment, a portion RS of the processed adhesive layer AD-L may be attached to the carrier panel CF to be removed. Thus, an exposed surface AD_RS of an adhesive layer AD-R, exposed by removing the carrier panel CF, may have a slightly nonuniform surface. In such an embodiment, the thickness of the adhesive layer AD-R, exposed by removing the carrier panel CF, may be relatively smaller than that of the processed adhesive layer AD-L. The adhesive layer AD-R described above with reference to FIG. 4J is merely exemplary. In an alternative embodiment of a process of manufacturing a display apparatus in accordance with the invention, the carrier panel CF may be removed without damage to the processed adhesive layer AD-L. In such an embodiment, the adhesive layer AD-R, exposed by removing the carrier panel CF, may have substantially a same thickness as the processed adhesive layer AD-L.

Figure 4K:
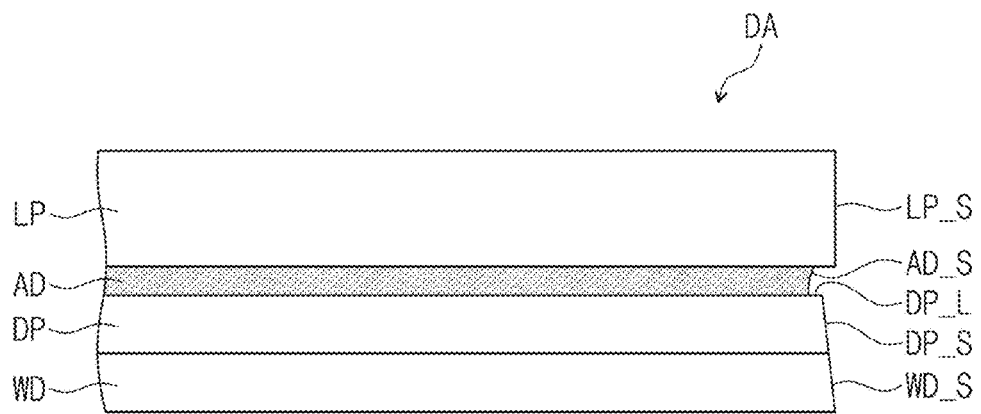
Figure 4L:
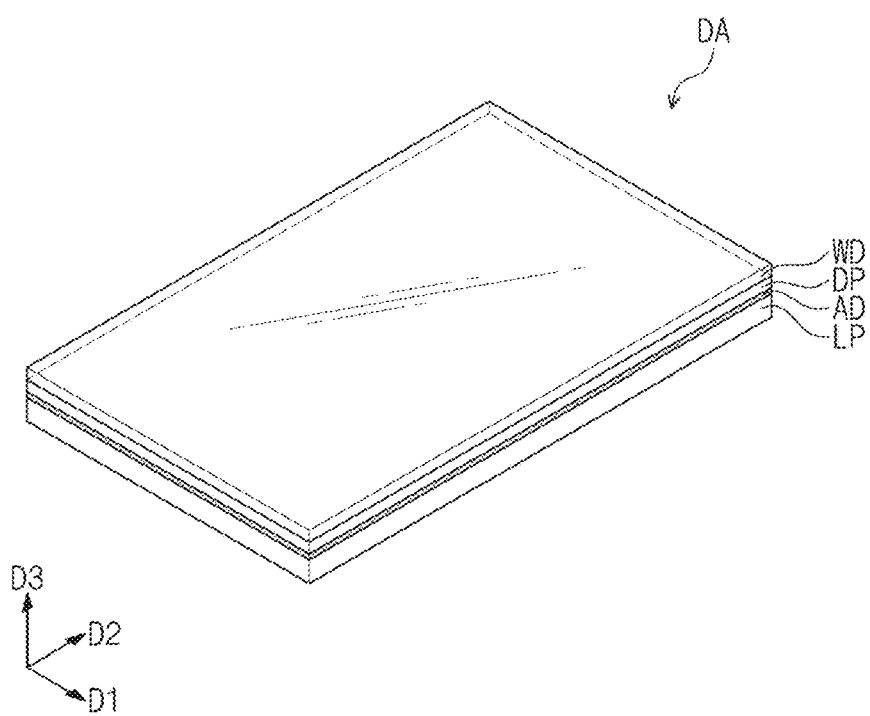

Then, as illustrated in FIGS. 4K and 4L, a lower protective panel LP is attached to form a display apparatus DA. The lower protective panel LP may be attached to a surface of the adhesive layer AD-R that is exposed by removing the carrier panel CF. In such an embodiment, a separate adhesive layer may be added to the lower protective panel LP to be connected to the adhesive layer AD-R that is exposed by removing the carrier panel CF. In an embodiment, as described above, the adhesive layer AD of the display apparatus DA may be formed as the adhesive layer AD-R that is exposed by removing the carrier panel CF or may have a structure in which the adhesive layer AD-R, exposed by removing the carrier panel CF, and the separate adhesive layer are stacked one on another, but is not limited to any one embodiment.

A lateral surface LP_S of the lower protective panel LP of the display apparatus DA may not be aligned with the lateral surface DP_S of the display panel DP or the lateral surface WD_S of the window WD. The lateral surface DP_S of the display panel DP and the lateral surface WD_S of the window WD may be inclined with respect to the lateral surface LP_S of the lower protective panel LP. The lateral surface AD_S of the adhesive layer AD may be recessed from the lateral surface DP_S of the display panel DP or the lateral surface WD_S of the window WD and may be recessed with respect to the lateral surface LP_S of the lower protective panel LP.

FIG. 4L is a view in which the display apparatus DA of FIG. 4K is inverted such that the window WD faces a front surface thereof. The completed display apparatus DA may substantially correspond to the display apparatus DA illustrated in FIG. 1A.

In accordance with an embodiment of the invention, the emitting of the additional laser beam LB-D for the processing is further included after the emitting of the laser beam LB for the cutting. The carrier panel CF may be easily delaminated by removing the portion of the lateral surface of the cut adhesive layer AD-C through the emitting of the additional laser beam LB-D. Thus, a conventional or existing process may be utilized to process an adhesive layer without adding a separate process, thereby simplifying the process, reducing the cost of the process, and improving process reliability.

Figure 5A:
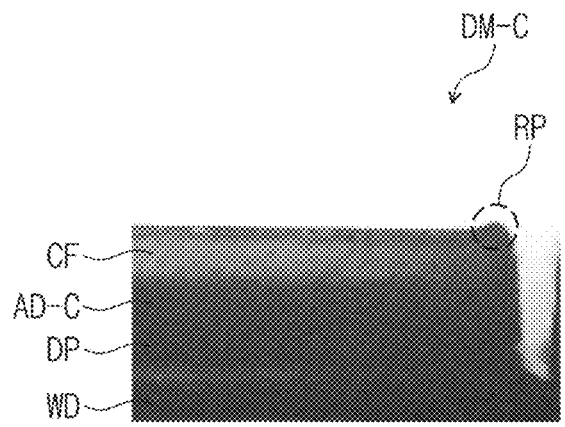
FIGS. 5A and 5B are pictures illustrating cross sections of a display module in accordance with an embodiment of the invention.
Figure 5B:
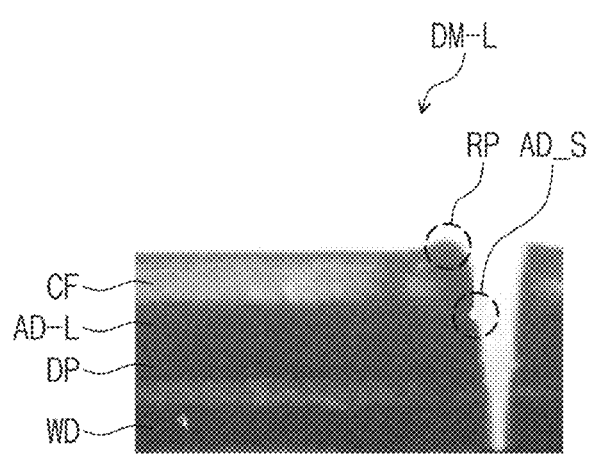

FIGS. 5A and 5B are pictures illustrating cross sections of display modules in accordance with an embodiment of the invention. FIG. 5A illustrates a picture of a first display module DM-C that may correspond to the cut display module DM-C illustrated in FIG. 4E. FIG. 5B illustrates a picture of a second display module DM-L that may correspond to the processed display module DM-L illustrated in FIG. 4H. Hereinafter, an embodiment of the invention will be described with reference to FIGS. 5A and 5B.

In an embodiment, as illustrated in FIG. 5A, the first display module DM-C includes a window WD, a display panel DP, an adhesive layer AD-C, and a carrier panel CF, and a protrusion portion RP may be defined on a rear surface of the carrier panel CF. It is shown in FIG. 5A that an inclined surface is defined on a lateral surface of the first display module DM-C by removing a deformation area DFA.

In an embodiment, as illustrated in FIG. 5B, the second display module DM-L includes a carrier panel CF, an adhesive layer AD-L, a display panel DP, and a window WD. In such an embodiment, it is shown in FIG. 5B that the adhesive layer AD-L has a lateral surface AD_S having a relatively concave shape as compared to the adhesive layer AD-C illustrated in FIG. 5A. In an embodiment, as described above, the concave lateral surface AD_S of the adhesive layer AD-L is defined by removing a portion of the adhesive layer AD-C through a process including an emission of the additional laser beam LB-D. Thus, the carrier panel CF may be easily delaminated.

Figure 6A:
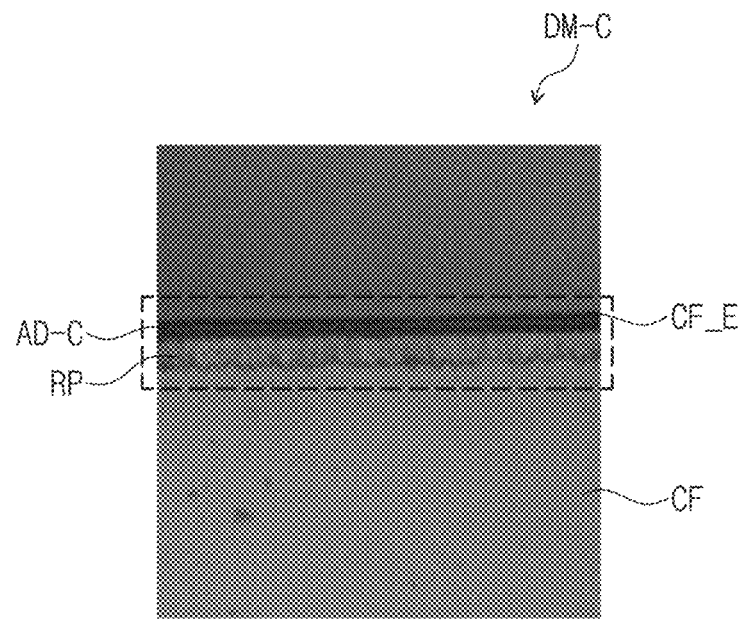
FIGS. 6A and 6B are pictures illustrating planes of display modules in accordance with an embodiment of the invention.
Figure 6B:
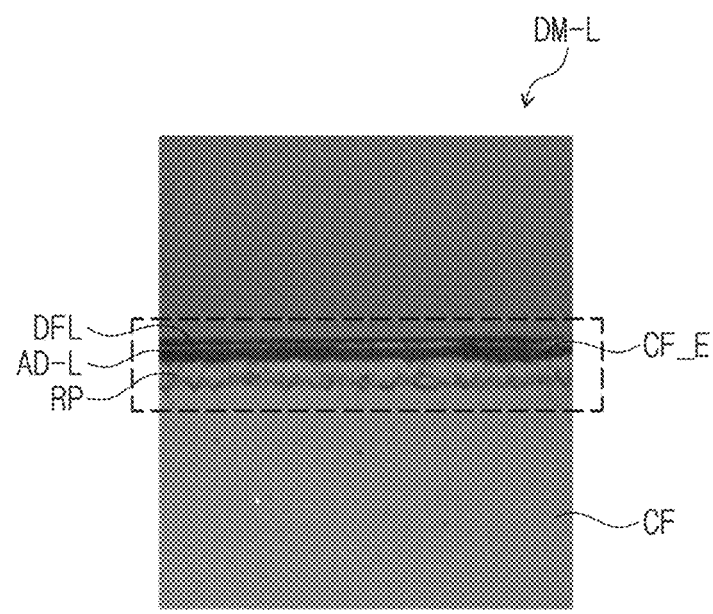

FIGS. 6A and 6B are pictures illustrating planes of display modules in accordance with an embodiment of the invention. FIGS. 6A and 6B may correspond to plan views that are viewed on the carrier panel CF. FIG. 6A illustrates a picture of a first display module DM-C that may correspond to the cut display module DM-C illustrated in FIG. 4E. FIG. 6B illustrates a picture of a second display module DM-L that may correspond to the processed display module DM-L illustrated in FIG. 4H. Hereinafter, an embodiment of the invention will be described with reference to FIGS. 6A and 6B.

In FIG. 6A, lateral surfaces of a carrier panel CF and an adhesive layer AD-C may be seen when the first display module DM-C is viewed in a plan view. As described above, as a lateral surface of the first display module DM-C have an inclined surface, the lateral surface of the adhesive layer AD-C may be positioned to be exposed to the outside of an end CF_E of the carrier panel CF. Thus, the laser beam LB-D may be easily or effectively emitted along the lateral surface of the adhesive layer AD-C.

As illustrated in FIG. 6B, a portion of the second display module DM-L, indicated by a processing line DFL, may substantially correspond to an area that is obtained by removing a portion of the adhesive layer AD-C by the laser beam LB-D. A space, damaged by the laser beam LB-D, may be formed along the processing line DFL by removing the portion of the adhesive layer AD-C along the processing line DFL. In accordance with an embodiment of the invention, the carrier panel CF may be easily delaminated by removing the portion of the adhesive layer AD-C. Further, in accordance with an embodiment of the invention, when viewed in a plan view, the lateral surfaces of the adhesive layers AD-C are exposed by forming the inclined surfaces on the lateral surfaces of the first display modules DM-C. Thus, the portions of the adhesive layers AD-C may be easily or effectively processed by a laser beam.

Figure 7A:
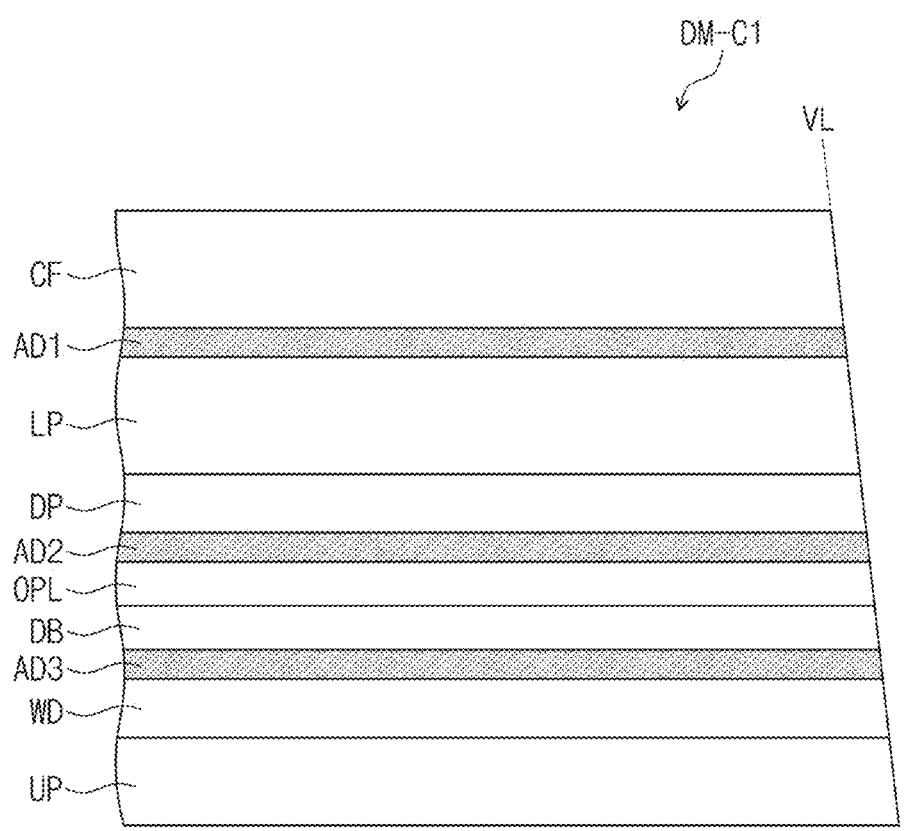
FIGS. 7A and 7B are cross-sectional views of portions of display modules in accordance with an embodiment of the invention.
Figure 7B:
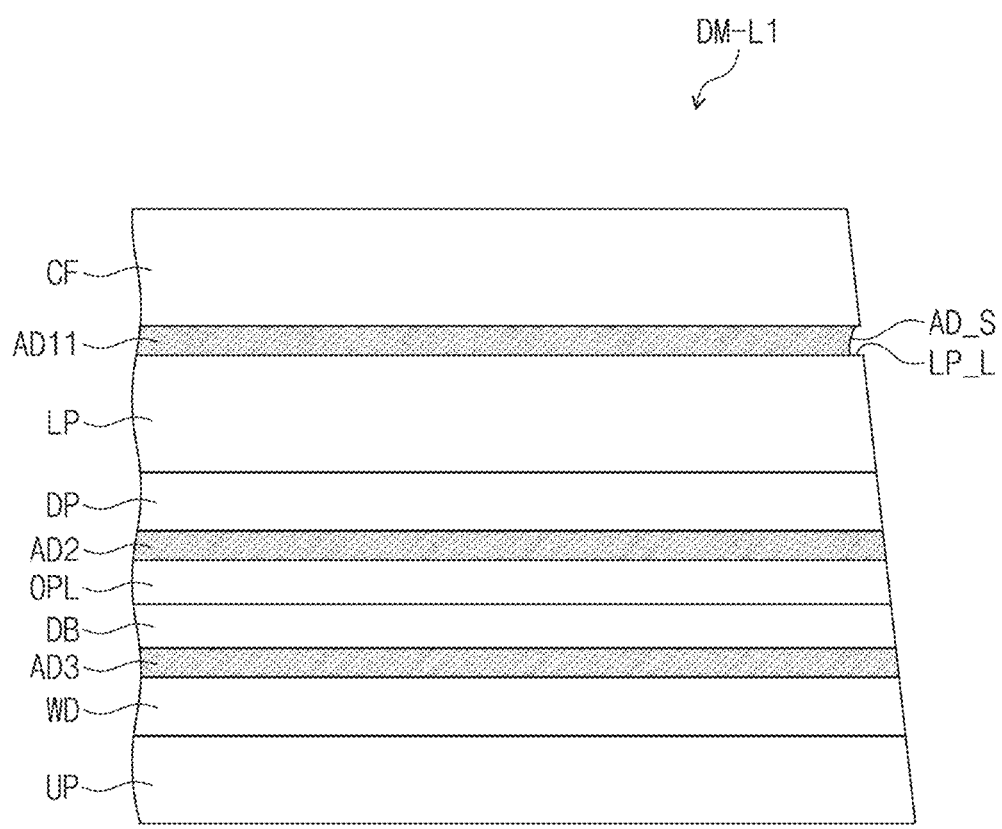

FIGS. 7A and 7B are cross-sectional views of portions of display modules in accordance with an embodiment of the invention. Hereinafter, an embodiment of the invention will be described with reference to FIGS. 7A and 7B. In FIGS. 7A and 7B, the same or like elements or components as those described above with reference to FIGS. 1A to 6B are denoted by the same or like reference numerals, and any repetitive detailed description thereof will be omitted.

In an embodiment, as illustrated in FIG. 7A, a display module DM-C1 (hereinafter referred to as a first display module DM-C1) may include a carrier panel CF, a lower protective panel LP, a display panel DP, an optical panel OPL, a damping panel DB, a window WD, an upper protective panel UP, and a plurality of adhesive layers AD1, AD2, and AD3. The first display module DM-C1 may correspond to an embodiment in which the lower protective panel LP, the optical panel OPL, the damping panel DB, the upper protective panel UP, and the adhesive layers AD2 and AD3 are added to the cut display module DM-C (see FIG. 4E). Hereinafter, any repetitive detailed description of elements or components corresponding to the cut display module DM-C will be omitted.

In an embodiment, as shown in FIG. 7A, the lower protective panel LP is disposed between the display panel DP and the carrier panel CF. The lower protective panel LP may have insulating properties. In an embodiment, the lower protective panel LP may have flexibility. In an embodiment, the lower protective panel LP may include PI, for example.

The optical panel OPL may be disposed between the display panel DP and the window WD. The optical panel OPL may improve visibility of the display panel DP by reducing the external light reflectance of the display panel DP. In one embodiment, for example, the optical panel OPL may include a polarizing film or a scattering prevention film.

The damping panel DB may be disposed between the display panel DP and the window WD. The damping panel DB may reduce the influence of an impact, which may be delivered through the window WD, on the display panel DP. The damping panel DB may have high shock absorption and may be optically transparent. In one embodiment, for example, the damping panel DB may include a urethane resin or the like.

The upper protective panel UP covers the window WD. The upper protective panel UP may protect the window WD. The upper protective panel UP may have higher rigidity than the window WD. Alternatively, the upper protective panel UP may have a structure in which a hard coating layer and a soft film are stacked one on another.

The adhesive layers AD1, AD2, and AD3 may include first to third adhesive layers AD1, AD2, and AD3. The first adhesive layer AD1 is disposed between the carrier panel CF and the lower protective panel LP. The first adhesive layer AD1 may substantially correspond to the cut adhesive layer AD-C illustrated in FIG. 4E.

The second adhesive layer AD2 is disposed between the display panel DP and the optical panel OPL to bond the display panel DP to the optical panel OPL. The second adhesive layer AD2 may include at least one of an optical clear adhesive, an optical clear resin, or a pressure-sensitive adhesive.

The third adhesive layer AD3 is disposed between the window WD and the damping panel DB to bond the window WD to the damping panel DB. The third adhesive layer AD3 may include at least one of an optical clear adhesive, an optical clear resin, or a pressure-sensitive adhesive.

In an embodiment, additional adhesive layers may be included in addition to the adhesive layers AD1, AD2 and AD3, and may also be disposed between the optical panel OPL and the damping panel DB or between the display panel DP and the lower protective panel LP.

A lateral surface of the first display module DM-C1 may include an inclined surface along a virtual line VL when viewed in cross section. Lateral surfaces of the carrier panel CF, the lower protective panel LP, the display panel DP, the optical panel OPL, the damping panel DB, the window WD, the upper protective panel UP and the adhesive layers AD1, AD2 and AD3, constituting the first display module DM-C1, are aligned along the virtual line VL.

In an embodiment, as illustrated in FIG. 7B, a display module DM-L1 (hereinafter referred to as a second display module DM-L1) may correspond to the first display module DM-C1 that is illustrated in FIG. 7A and has gone through processing using the laser beam LB-D (see FIG. 4H). In one embodiment, for example, the second display module DM-L1 may include a first adhesive layer AD11 (hereinafter referred to as a processed adhesive layer AD11) defined by processing the first adhesive layer AD1 of the first display module DM-C1.

A lateral surface AD_S of the processed adhesive layer AD11 may be recessed from lateral surfaces of other components, for example, a lateral surface of a carrier panel CF or a lateral surface of a lower protective panel LP. The lateral surface AD_S of the processed adhesive layer AD11 is defined by a portion, damaged or removed by the laser beam LB-D, of the first adhesive layer AD1 of the first display module DM-C1, and a portion of a rear surface LP_L of the lower protective panel LP, which is in contact with the lateral surface AD_S, may be exposed through the lateral surface AD_S of the processed adhesive layer AD11.

In accordance with an embodiment of the invention, the second display module DM-L1 allows the carrier panel CF to be easily delaminated by including the adhesive layer AD11 partially damaged or removed, even when the second display module DM-L1 further includes a plurality of panels. Thus, process reliability may be improved.

Figure 8A:
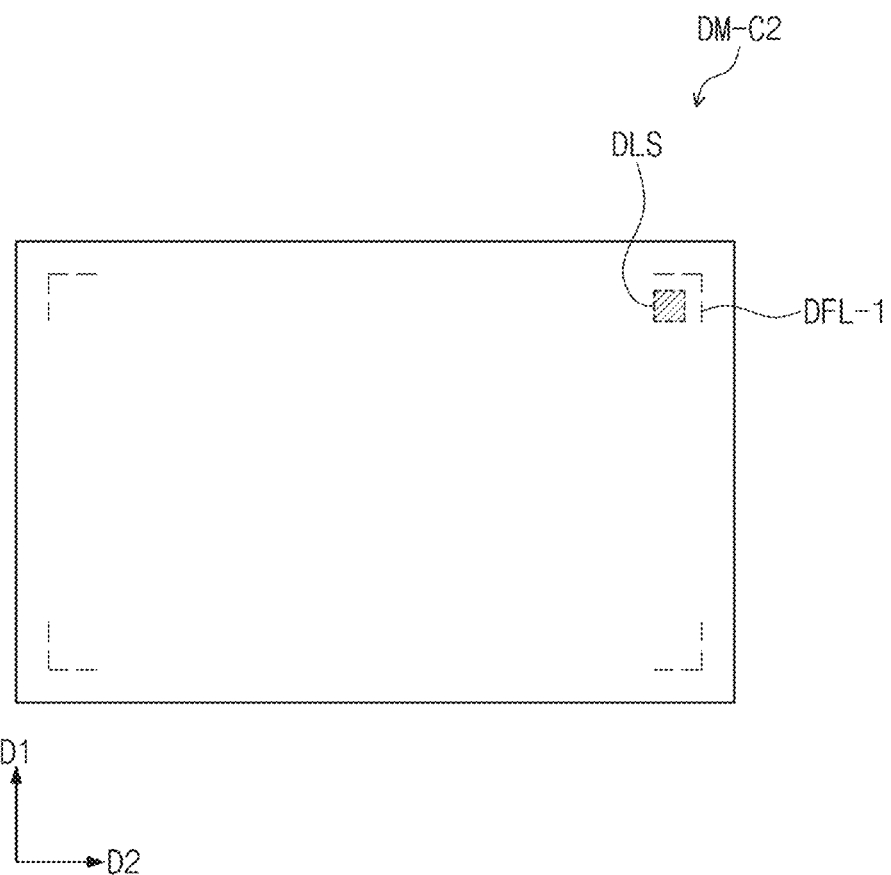
FIGS. 8A and 8B are plan views of display modules in accordance with an embodiment of the invention.
Figure 8B:
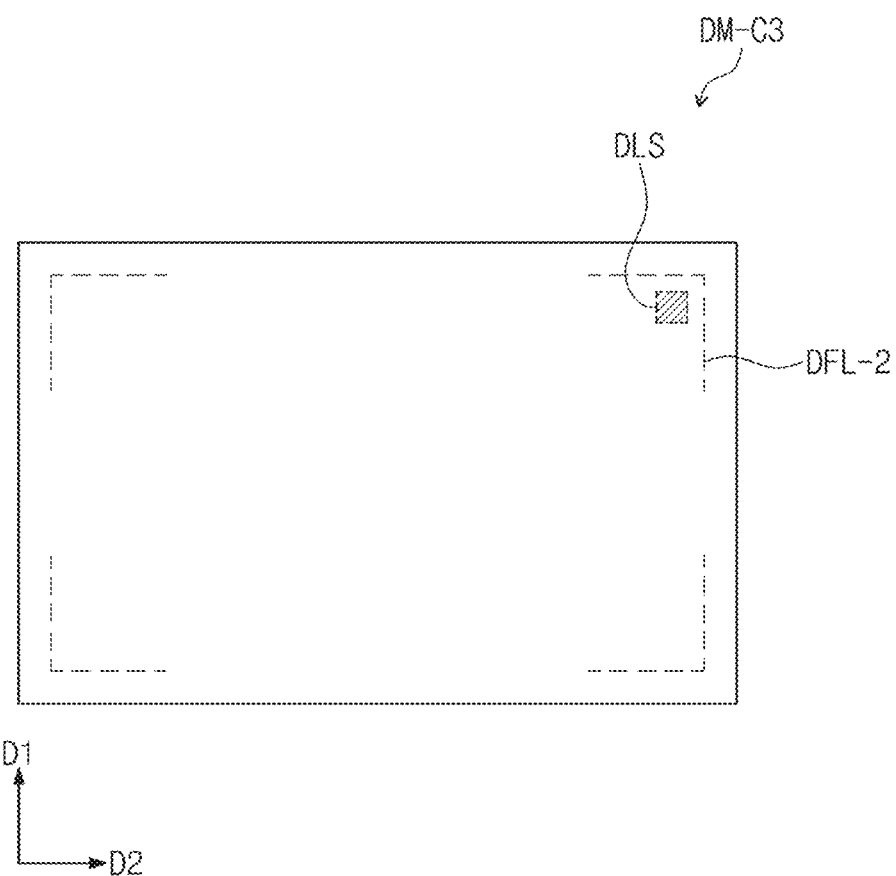

FIGS. 8A and 8B are plan views of display modules in accordance with an embodiment of the invention. FIGS. 8A and 8B illustrate display modules in a process that corresponds to that of FIG. 4F. Hereinafter, an embodiment of the invention will be described with reference to FIGS. 8A and 8B. In FIGS. 8A and 8B, the same or like elements or components as those described above with reference to FIGS. 1A to 7B are denoted by the same or like reference numerals, and any repetitive detailed description thereof will be omitted.

In an embodiment, as illustrated in FIG. 8A, a processing line DFL-1 of a display module DM-C2 may be provided as a plurality of processing lines that are intermittently arranged. The processing lines DFL-1 may only be disposed in areas that are adjacent to four vertexes of the display module DM-C2 and may be defined to be separated from each other.

The processing lines DFL-1 may be defined to be adjacent to attachment areas DLS. The attachment areas DLS may be areas to which a delamination apparatus, such as the delamination roller DLR (see FIG. 4I), is attached. The attachment areas DLS are illustrated by hatching in the drawings, for ease of illustration.

The processing lines DFL-1 are partially defined in the areas that are adjacent to the attachment areas DLS, and thus the laser beam LB-D (see FIG. 4G) for processing an adhesive layer may be selectively emitted along the corresponding processing lines DFL-1. Thus, process time and process cost may be reduced.

Alternatively, as illustrated in FIG. 8B, processing lines DFL-2 of a display module DM-C3 may be intermittently provided and may also extend to an area outside of attachment areas DLS. When the adhesion of an adhesive layer is high or the attachment areas DLS having a narrow area are provided depending on the delamination apparatus, a process of delaminating a carrier panel may be stably performed by controlling the length of each of the processing lines DFL-2.

In accordance with an embodiment of the invention, a carrier panel may be easily removed, thereby improving process reliability in manufacturing a display apparatus. In such an embodiment, a display module may be formed by using a conventional or existing process, thereby simplifying the process and reducing the cost of the process.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the claims.

What is claimed is:

1. A method of manufacturing a display apparatus, the method comprising:
    providing an initial display module including a display panel, a carrier panel on a rear surface of the display panel, and an adhesive layer disposed between the display panel and the carrier panel, wherein the adhesive layer is in contact with the carrier panel;
    cutting the initial display module by emitting a first laser beam along a predetermined cutting line such that first lateral surfaces are formed;
    processing the adhesive layer by emitting a second laser beam along a predetermined processing line defined on insides of the first lateral surfaces such that a display module of the display apparatus is formed;
    removing the carrier panel from the display module; and
    forming the display apparatus by attaching a lower protective panel onto the rear surface of the display panel.

2. The method of claim 1, wherein the second laser beam has an intensity lower than an intensity of the first laser beam.

3. The method of claim 1, wherein the first lateral surfaces are inclined with respect to the rear surface of the display panel.

4. The method of claim 3, wherein
    lateral surfaces of the adhesive layer are exposed in the cutting of the initial display module, and
    the second laser beam is incident at an exposed lateral surfaces of the adhesive layer.

5. The method of claim 1, wherein an adhesive layer of the display module is defined by a portion of the adhesive layer of the initial display module.

6. The method of claim 1, wherein, when the carrier panel is removed, a portion of the adhesive layer, which is in contact with the carrier panel, is removed.

7. The method of claim 1, wherein the first laser beam forms a protrusion portion on a rear surface of the carrier panel.

* * * * *